(12) United States Patent
Joo et al.

(10) Patent No.: US 6,348,701 B1
(45) Date of Patent: Feb. 19, 2002

(54) METHOD FOR DETERMINING METAL CONCENTRATION IN A FIELD AREA

(75) Inventors: Young-Chang Joo, Seoul (KR); Amit P. Marathe, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/421,455

(22) Filed: Oct. 19, 1999

(51) Int. Cl.[7] .................................................. H01L 23/58
(52) U.S. Cl. ........................................................ 257/48
(58) Field of Search ................................. 438/5, 10, 11, 438/14, 17, 18, 296, 386, 424, 454; 257/48, 506, 508, 516, 520, 532

(56) References Cited

U.S. PATENT DOCUMENTS 5,751,015 A * 5/1998 Corbett et al. ................ 257/48

* cited by examiner

*Primary Examiner*—Keith Christianson
(74) *Attorney, Agent, or Firm*—Skjerven Morrill MacPherson LLP; Edward C. Kwok, Esq.

(57) ABSTRACT

The concentration of metal atoms in a field area between two trench structures is determined by applying a voltage on one of the trench structures and grounding the other. The resultant current flow between the trench structures is measured and used as an indicator of metal concentration in the field area.

4 Claims, 3 Drawing Sheets

METHOD FOR DETERMINING METAL CONCENTRATION IN A FIELD AREA

Background of the Invention

1. Field of the Invention

This invention relates to test structures and methods used in semiconductor device fabrication.

2. Description of the Related Art

Damascene refers to a process for making interconnect lines in a semiconductor device. In a damascene structure 100 shown in FIG. 1A, damascene trenches 101 and 105 are formed using conventional patterning (e.g. lithography and etching) techniques. A diffusion barrier 102 is deposited on the trenches to prevent leakage of subsequently deposited metal 103 into a dielectric layer 104. In this particular example, metal 103 is copper while dielectric layer 104 is a low dielectric constant ("low-k") dielectric material such as TEOS.

Chemical mechanical planarization ("CMP") is used to remove portions of metal 103 which are outside the trenches and to obtain a flat surface for subsequent formation of overlying layers. CMP removes material from the semiconductor wafer by pressing the device side of the wafer against a rotating polishing pad in the presence of a slurry. FIG. 1B depicts structure 100 after a CMP process. A post-CMP clean is performed on the wafer containing structure 100 immediately after the CMP process to remove contaminants, residual slurry, and loose metal particles that were introduced during polishing.

As shown in FIG. 1B, a poor post-CMP clean can leave metal atoms 107 in field area 108, thereby causing a line-to-line short between trenches 101 and 105. Line-to-line shorts can lead to device unreliability if not catastrophic failure. Thus, the amount of metal atoms left in the area between the trenches (the field area) must be periodically determined and analyzed to ensure that metal atoms are adequately removed by the post-CMP clean process. Common methods for measuring metal concentrations in field areas include Secondary Ion Mass Spectroscopy ("SIMS"), Auger mapping, and Electron Energy Loss Spectroscopy ("EELS"). These methods, however, require expensive equipment and long setup time.

Thus, it is highly desirable to have a fast, sensitive, and simple technique for measuring metal concentrations in a field area.

SUMMARY OF THE INVENTION

In an embodiment of the invention, a voltage is applied on a first trench structure while a second trench structure is grounded. The resultant current is measured and used as an indicator of metal concentration in the field area between the trench structures.

DETAILED DESCRIPTION

The present invention provides a novel test structure and method for determining metal concentrations in a field area.

Figure 1A:
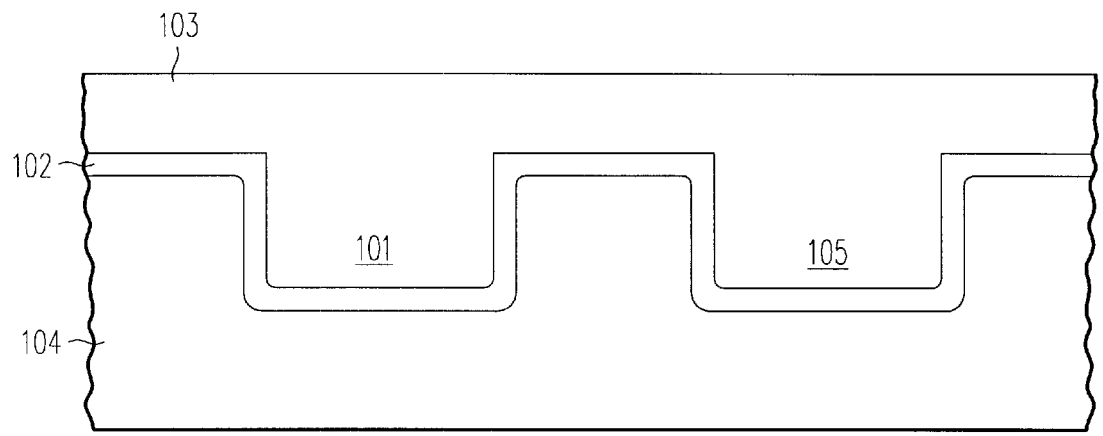
FIGS. 1A–1B show cross sections of a trench structure in the prior art.
Figure 1B:
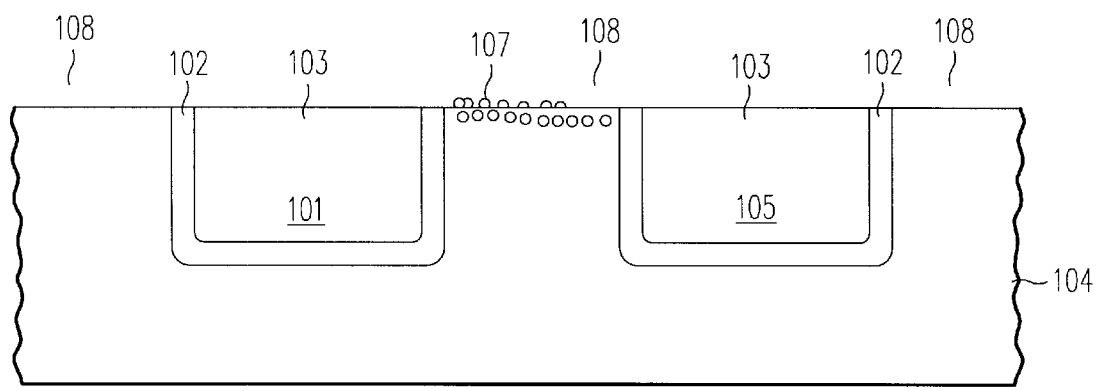
Figure 2:
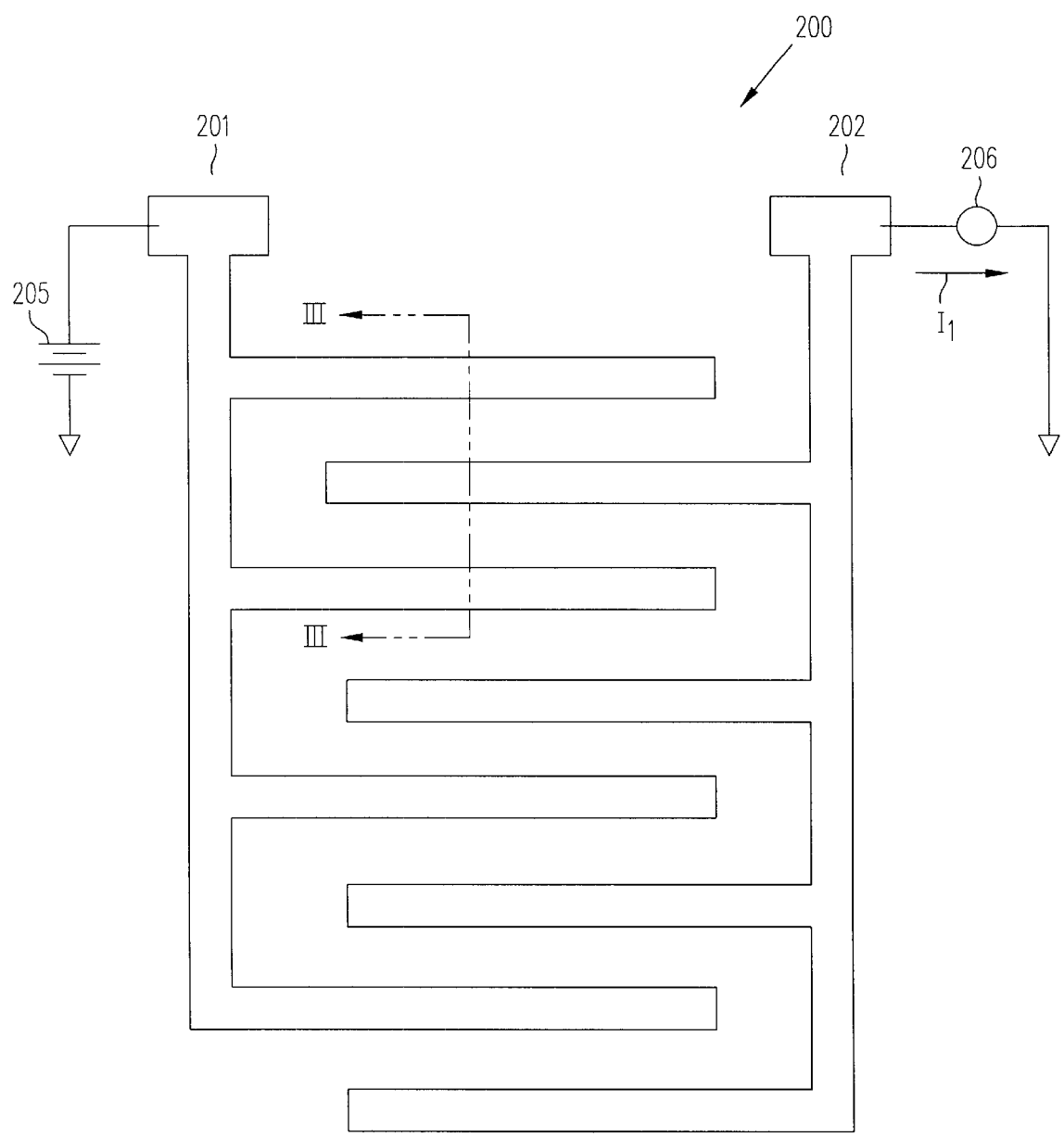
FIG. 2 shows a top view of a test structure and wiring set-up in accordance with the present invention.

FIG. 2 shows the top view of a test structure 200 which is fabricated on a semiconductor wafer in accordance with the present invention. Test structure 200 consists of comb structures 201 and 202. Although two straight parallel trench structures can be used with the present invention, the "zig-zag" profile of structures 201 and 202 increases the trench length and area of the structures. More trench area allows for more leakage flow between the trenches thereby improving the sensitivity of the test. Multiple copies of test structure 200 may be fabricated on selected regions of a monitor or device wafer.

Figure 3A:
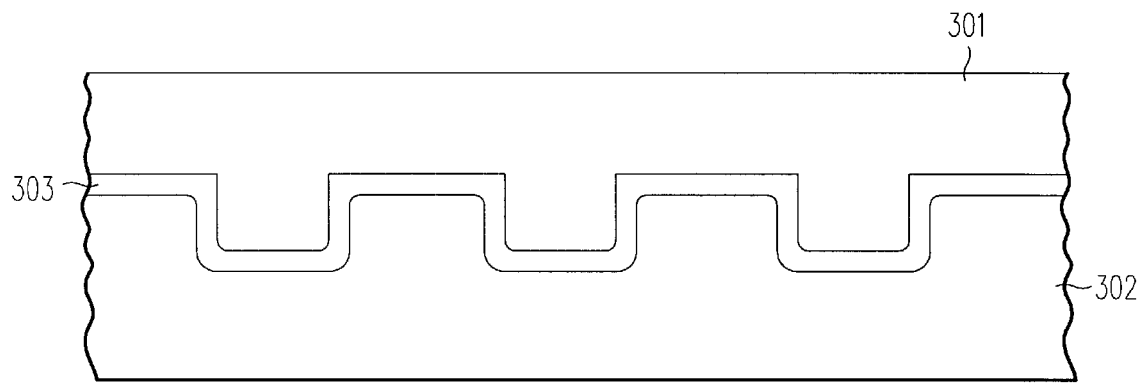
FIG. 3A shows a cross section of the test structure shown in FIG. 2 before CMP.
Figure 3B:
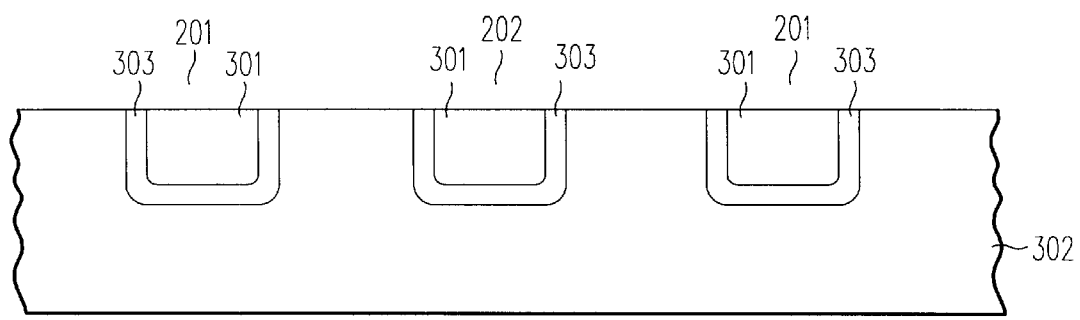
FIG. 3B shows a cross section of the test structure shown in FIG. 2 after CMP and post-CMP clean.

Comb structures 201 and 202 are fabricated using a damascene process. After the trenches for structures 201 and 202 are formed using conventional patterning techniques, a diffusion barrier 303 is deposited on the trenches (FIG. 3A). Diffusion barrier 303 may be any diffusion barrier material common to the semiconductor industry such as tantalum, tantalum nitride, titanium nitride, or tungsten nitride. Metal 301, which is deposited in the trenches subsequent to barrier 303, is copper in this embodiment but may also be any interconnect conductor such as aluminum or tungsten. After excess metal 301 is removed by CMP (FIG. 3B), post-CMP cleaning is performed on the wafer containing test structure 200. FIG. 3B shows a cross section of test structure 200 taken along section line III—III shown in FIG. 2.

After the post-CMP clean process, test structure 200 is wired as shown in FIG. 2. To determine the concentration of metal atoms in the field area of test structure 200, a voltage 205 is applied on comb structure 201 while the resultant current $I_1$, is measured using amp meter 206. Because $I_1$ is directly related to the amount of metal atoms in the field area between comb structures 201 and 202, $I_1$ is a good indicator of the metal concentration in the field area.

TABLE 1

|  |  | Wafer-1 | Wafer-2 | Wafer-3 | Wafer-4 | Wafer-5 |
| --- | --- | --- | --- | --- | --- | --- |
| Test Structure 200A |  |  |  |  |  |  |
| 20 V | median | 1.72E–8 A | 3.44E–8 A | 1.21E–8 A | 1.70E–8 A | 1.64E–8 A |
|  | sigma | 1.02 | 0.86 | 1.87 | 0.84 | 1.00 |
| 30 V | median | 6.04E–8 A | 2.67E–7 A | 1.80E–7 A | 1.01E–7 A | 2.19E–7 A |
|  | sigma | 1.52 | 1.14 | 0.66 | 0.41 | 0.75 |
| 50 V | median | 1.11E–5 A | 2.15E–5 A | 1.90E–5 A | 1.26E–5 A | 1.90E–5 A |
|  | sigma | 0.82 | 0.52 | 0.42 | 0.57 | 0.38 |

TABLE 1-continued

|  |  | Wafer-1 | Wafer-2 | Wafer-3 | Wafer-4 | Wafer-5 |
|---|---|---|---|---|---|---|
| Test Structure 200B |  |  |  |  |  |  |
| 20 V | median | 2.01E−8 A | 1.35E−7 A | 7.18E−8 A | 2.11E−8 A | 7.39E−8 A |
|  | sigma | 1.62 | 1.27 | 0.47 | 2.59 | 1.93 |
| 30 V | median | 5.09E−7 A | 1.81E−6 A | 1.29E−6 A | 8.53E−7 A | 1.48E−6 A |
|  | sigma | 1.21 | 0.88 | 0.45 | 1.51 | 0.74 |
| 50 V | median | 2.37E−5 A | 3.84E−5 A | 3.35E−5 A | 2.78E−5 A | 3.40E−5 A |
|  | sigma | 0.52 | 0.35 | 0.27 | 0.48 | 0.27 |

Table 1 shows data from a test performed on five different wafers (wafer-1 to wafer-5) using the method of the present invention. Each wafer has 20 dies and each die has test structures 200A and 200B, which are both identical to test structure 200. Thus, for a particular test structure and test voltage, there are 20 resultant current measurements per wafer. Commercially available equipment for automating the voltage-current measurements include the model S900 from Keithley Instruments of Cleveland, Ohio. To improve the reliability of the test, the median and sigma (deviation) of the 20 resultant current measurements for each test voltage and test structure are used instead of the individual current measurements.

Looking at the data for wafer-1, for example, setting voltage 205 to 30 volts results in a median current of $6.04 \times 10^{-8}$ amps and a sigma of 1.52 for test structure 200A. This can be compared with wafer-2 which, for the same test structure and test voltage, generates a current of $2.67 \times 10^{-7}$ amps and a sigma of 1.14. Thus, the process used to fabricate wafer-1 leaves less metal in the field area than the process used to fabricate wafer-2. However, the sigma on wafer-2 is less than the sigma on wafer-1 which indicates that the process used on wafer-2 produces a more uniform result.

The resultant current can be compared to a known design current limit to determine if the metal concentration in a field area is too high. Assuming a design rule median current limit of $7 \times 10^{-8}$ amps at 20V in the region where structure 200B is located, Table 1 indicates that the process used to fabricate wafer-2, wafer-3, and wafer-5 are not acceptable as they generate more current than the design rule current limit. The invention can also be used in a production environment to detect shifts in the production process by performing the test on a test structure 200 fabricated on an unused region of the wafer and comparing the results to known values.

A map of metal concentrations in field areas across the wafer can be generated by fabricating multiple copies of test structure 200 on different regions of the wafer and performing the test described above.

The description of the invention given above is provided for purposes of illustration and is not intended to be limiting. Numerous variations are possible within the scope of the invention. The invention is set forth in the following claims.

What is claimed is:

1. A test structure for determining metal concentration in a field area comprising:

a first trench structure having a terminal for applying a first potential thereon; and, a second trench structure having a terminal for applying a second potential thereon.

2. The structure of claim 1 wherein said second potential is ground potential.

3. The structure of claim 1 wherein a length of the sidewalls of said first and second trench structures are substantially parallel to one another.

4. The structure of claim 1 wherein a current meter is coupled to said second trench structure.

* * * * *